United States Patent
Lüthje et al.

(10) Patent No.: US 6,294,020 B1
(45) Date of Patent: *Sep. 25, 2001

(54) DEVICE FOR APPLYING PHOTORESIST TO A BASE BODY SURFACE

(75) Inventors: Holger Lüthje, Halstenbeck; Simone Daaud, Braunschweig; Reinulf Böttcher, Bielefeld, all of (DE)

(73) Assignee: Heidelberger Druckmaschinen AG, Heidelberg (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/242,768

(22) Filed: Feb. 19, 1999

Related U.S. Application Data

(63) Continuation of application No. PCT/EP97/04510, filed on Aug. 19, 1997.

(30) Foreign Application Priority Data

Aug. 19, 1996 (DE) ............................... 196 33 407

(51) Int. Cl.$^7$ ....................................... B05C 1/02
(52) U.S. Cl. .......................... 118/218; 118/232; 118/268; 118/401
(58) Field of Search ................................... 118/218, 232, 118/268, 323, 401; 222/187; 346/141; 347/2, 3

(56) References Cited

U.S. PATENT DOCUMENTS

| | | | |
|---|---|---|---|
| 2,599,561 | * 6/1952 | Knight | 118/268 |
| 2,617,468 | * 11/1952 | Holcomb | 118/218 |
| 2,660,112 | * 11/1953 | Delplanque | 118/268 |
| 3,649,283 | * 3/1972 | Christenson et al. | 96/85 |
| 3,718,080 | * 2/1973 | Yamamoto et al. | 118/268 |
| 4,663,639 | * 5/1987 | Owen et al. | 346/140 R |
| 4,715,105 | * 12/1987 | Beaver | 29/419 G |
| 4,845,512 | * 7/1989 | Arwal | 346/1.1 |
| 5,201,951 | * 4/1993 | Shigeta | 118/73 |
| 5,498,444 | * 3/1996 | Hayes | 427/162 |
| 5,534,101 | * 7/1996 | Keyworth et al. | 156/244.12 |

FOREIGN PATENT DOCUMENTS

| | | |
|---|---|---|
| 43 39 493 A1 | 5/1994 | (DE) . |
| 43 29 338 A1 | 3/1995 | (DE) . |
| 0 333 641 B1 | 9/1989 | (EP) . |
| 0 440 079 A2 | 8/1991 | (EP) . |
| 609478 | * 2/1993 | (EP) . |
| 641648 | * 8/1995 | (EP) . |
| 63-019657 | 1/1988 | (JP) . |
| 08-029615 | 2/1996 | (JP) . |

OTHER PUBLICATIONS

"Fabrication of a Fiber Probe with a Nanometric Profusion for Near–Field Optical Microscopy by a Novel Techniqe of Three–Dimensional Nanophoto Lithography" Takuya Matsumoto and Matoichi Ohtsu, 1996 IEEE Journal of Ligtwave Technology vol. 14 No. 10, Oct. 1996.*

* cited by examiner

Primary Examiner—Laura Edwards
(74) Attorney, Agent, or Firm—Herbert L. Lerner; Laurence A. Greenberg; Werner H. Stemer

(57) ABSTRACT

An applicator device for applying photoresist to a surface of a base body having a receiving device therefor, including a photoresist feeder movable relative to the base body, the feeder being a point source device, and a device for performing a defined movement of the base body, comprising a conically shaped tip formed on the point source device for applying photoresist in a defined spot.

9 Claims, 4 Drawing Sheets

DEVICE FOR APPLYING PHOTORESIST TO A BASE BODY SURFACE

CROSS REFERENCE TO RELATED APPLICATION

This is a continuation of copending International Application PCT/EP97/04510, filed Aug. 19, 1997, which designated the United States.

BACKGROUND OF THE INVENTION

1. Field of the Invention

The invention relates to a method and a device for applying photoresist to a base body surface.

From semiconductor coating, especially of wafers, methods such as spinning, immersion or spraying are known for applying a coating of photoresist. Because an exposure time has to be selected, especially in the coating of wafers, a precise resist thickness is very important.

In the spinning method, for example, the wafer is rotated after the photoresist has been applied as centrally as possible thereon. The centrifugal forces that are then operative thus distribute the photoresist substantially uniformly over the surface of the flat wafer.

Immersion and spray methods can be employed, for example, for three-dimensional substrates. In the immersion method, however, it often happens that the layer thickness cannot be made homogeneous in all the regions of the surface, but rather, a bead of resist remains at the end of the surface region and does not permit uniform exposure or illumination. A problem also arises in the spraying method. Although relatively large surfaces may be wetted quite well therewith, nevertheless, the resist contracts during drying. As a result, similarly to the immersion method, deviations occur in the peripheral region of the structure which impair the uniformity of the resist layer. The thickness of the resist beads at the edge can amount to five times the desired layer thickness.

The application of photoresist to smooth base bodies is employed for photolithographic techniques. These techniques are used to produce layer structures, with the aid of masks or locally acting beam-type recording devices using high-energy radiation, a radiation-sensitive material being applied to a surface to be structured and irradiated, and then developed. In this way, photoresist patterns that serve as a mask for various thin-film technologies can be created. Irradiating the radiation-sensitive material can be performed, for example, by electromagnetic waves or corpuscular radiation.

In photolithography, ultraviolet light having a wavelength of approximately 430 nm to 200 nm is typically employed. Photolithographic methods are widely applicable in the field of producing semiconductor circuits, sensors, or microcircuitry systems.

In the heretofore known applications, even and, in particular, macroscopically flat substrates, or substrates with only very slightly curved surfaces, are coated as base bodies.

In the conventional spinning method, the desired photoresist thickness is adjusted by way of the rotational speed of the spinner and the viscosity of the photoresist. Depending upon the particular application, layer thicknesses of a few hundred nanometers to a few tens of micrometers are needed, and must be applied with great homogeneity in the region of the surface of the base body to be structured. As already noted hereinbefore, however, the spinning method can be used only for macroscopically even or flat surfaces of a base body.

The beads of resist that form as a resist-thickness inhomogeneity in the peripheral region, particularly in the immersion method, lead to an impermissible spacing between the mask and the substrate known as the "proximity effect", upon the exposure to light in the contact method. This affects the quality and resolution of the photoresist structures, which proves to be disadvantageous. A further disadvantage is considered to be that this peripheral region, because of the greater layer thickness, receives too slight a radiation dosage, and the patterns provided thereat are therefore only inadequately formed, and/or residues of resist remain between the patterns.

With resist coating by the spray method, the same structural problems discussed above arise. Furthermore, with this method, the layer thicknesses of a few micrometers that are typically employed for photolithography can be attained only with highly diluted photoresists, which has a disadvantageous effect upon the quality of the photoresist layer. The layer has inhomogeneities in resist thickness at the corners and edges. In addition, with the spraying method, only large-area coatings can be provided, which, from a technological and economic standpoint, with a view to low photoresist consumption, is actually undesirable. In view of these considerations, it would be more appropriate to coat defined portions of a surface. Another disadvantage of both the spraying method and the immersion method is the comparatively high consumption of photoresist.

A method of spraying layers of flat or even surfaces has become known heretofore from the published European Patent Document EP 0 609 478 A1. In this regard, discrete drops are applied to the surface and are then evened or spread out evenly in further method steps. The method is also suitable only for flat substrates, such as printed circuit boards.

The published German Patent Document DE 43 29 338 A1 discloses only a flat substrate in which a pattern is produced by a type of ink jet printing head.

In the prior art, to apply relatively thick layers of photoresist, photoresist films are applied to base bodies, as a result of which better homogeneities in thickness can be achieved. However, these techniques are suitable only for relatively great layer thicknesses. Furthermore, when used for base bodies in the form of bodies of rotation, a seam is formed.

From the published German Patent Document DE 30 12 988 A1, a device and a method for producing a printing plate blank have become known, wherein a plate with a substrate is provided with a photopolymer strip of precisely dimensioned shape and thickness. To that end, the device is provided with a reservoir for the photopolymer, a bar or beam movable across the plate and being formed with a channel at an underside thereof, supply lines connecting the channel to the reservoir, and a stripper blade formed in the bar. During the production of the printing plate blank, the photopolymer layer is applied to the substrate. Next, the photopolymer layer is irradiated through a mask by a chemically active radiation, and the nonirradiated region covered by the mask is then removed. The photopolymer is delivered under the influence of gravity and, to that end, the photopolymer is kept at a pressure of a predetermined liquid level of 2.5 to 25 cm in the reservoir. The viscosity of the photopolymer is described in this reference as being 500 to 20,000 cP, preferably 2000 cP. The photopolymer layer is applied with a layer thickness of 25 to 510 μm. The supply lines for the liquid photopolymer are provided as capillary channels formed in the bar. The individual supply lines have a diameter of 0.76 to 12.7 mm, in particular 2.28 to 6.35 mm. The individual outlet openings and supply lines, respectively, have a mean spacing of 3.18 to 25.4 mm, and in particular 6.35 to 12.7 mm. As a result, a polymer strip approximately 40 cm wide and approximately 60 cm long is formed in one operating step or pass on the substrate of the smooth plate of the printing plate blank.

SUMMARY OF THE INVENTION

It is accordingly an object of the invention to provide an improved device and method for applying photoresist to a base body surface, more particularly, also to a surface that is not even or flat, and may be on a body of rotation, and wherein a defined, homogeneous, uniformly thin and reliable resist layer may be applied in an advantageous manner to the surface of the body.

With the foregoing and other objects in view, there is provided, in accordance with one aspect of the invention, an applicator device for applying photoresist to a surface of a base body having a receiving device therefor, including a container movable relative to the base body, the feeder being a point source device, and a device for performing a defined movement of the base body, comprising a conically shaped tip formed on the point source device for applying photoresist in a defined spot.

In accordance with another feature of the invention, the conically shaped tip is formed as one of a conically tapering fiber bundle and a capillary system provided with a conically tapering tip.

In accordance with a further feature of the invention, the point source device has a pulse printer.

In accordance with an added feature of the invention, the conically shaped tip has a radius of curvature of from 1 $\mu$m to 100 $\mu$m.

In accordance with an additional feature of the invention, the point source device has a tubule with a reservoir for photoresist and, in conjunction therewith, a fiber bundle with the conically shaped tip, and a shrink-fitting sleeve connecting the fiber bundle and the tubule.

In accordance with yet another feature of the invention, the pulse printer has at least one nozzle-like element, an actuator system, at least one of a supply chamber and a reservoir for photoresist, and connecting elements for connecting the at least one nozzle-like element and the at least one supply chamber and reservoir.

In accordance with yet a further feature of the invention, the point source device is at least one of an indexable array of nozzles and an indexable array of styli.

In accordance with yet an added feature of the invention, the at least one indexable array of nozzles and indexable array of styli is formed of a plurality of separately triggerable nozzles and styli, respectively, as a microsystem.

In accordance with another aspect of the invention, there is provided a method for applying photoresist to a surface of a base body, which comprises displacing a container and the surface of the base body to be provided with the photoresist relative to one another in one of a predeterminable and a predetermined manner, adjusting the layer thickness of the photoresist on the surface of the base body by at least one of varying the displacement speed of the container, varying the permeability of at least one point source device of the container, and varying the rotational speed of the base body, applying the photoresist in a defined spot, and transporting photoresist from the point source device to the surface of the base body by one of gravity flow and regulating the feed pressure of the photoresist from a supply chamber.

In accordance with a further mode, the method of the invention includes guiding the photoresist through one of a conically tapering fiber bundle and a capillary system provided with a conically tapering tip.

In accordance with an added mode, the method of the invention includes controlling at least one of the application of photoresists of different viscosities and compositions, and the application of one of the groups of primers and other adhesion promoters, so that a cohesive layer is formed in a defined region or over the entire surface of the base body.

In accordance with an additional mode, the method of the invention includes applying the photoresist in a chamber wherein the base body and the container are disposed, and which contains saturated solvent vapor.

In accordance with yet another mode, the method of the invention includes, on the surface of the base body, at least one of applying different resist layer thicknesses and applying the photoresist homogeneously in at least one of a small, defined region and partial fields in locally or linearly limited form.

In accordance with a concomitant mode, the method of the invention includes applying the photoresist in droplet form, with a layer thickness of up to 10 $\mu$m, to the surface of the base body by at least one of feeding the photoresist from a distance thereto and by having the photoresist directly contact the surface of the base body.

The object of the invention is thus attained by a device for applying photoresist to surfaces of a base body, the device including a receptacle for the base body, a container movable relative thereto, and a device for moving the base body in a defined manner, the container having at least one point or dot source device, and the latter having a conically formed tip for applying photoresist in a defined dot form.

Provision is also made for the conically shaped tip to be formed as a conically tapering fiber bundle or a capillary system provided with a conically tapering tip.

The object of the invention is also attained by a method for applying photoresist to a surface of a base body, in that the surface of the base body to be provided with the resist, and a feeder for the photoresist are moved relative to one another in a predeterminable or predetermined manner, the layer thickness of the photoresist on the surface of the base body being adjusted by varying the displacement speed of the container and/or the permeability of one or more point source devices of the container and/or the rotational speed of the base body.

Thus, a device and a method for applying photoresist are created by which arbitrarily shaped base bodies can be uniformly provided with an especially thin layer of resist. The disadvantageous beads of resist at the respective edge or end of the three-dimensional body, which otherwise typically occur in the prior art, are no longer created. The most varying three-dimensional structures can be coated, in particular including machine components, tools, and components of the most varied type, as well as spectral photometers and other optical devices, respectively, in order to produce lens geometries and the like. Different resist thicknesses can also be applied to the respective base body, due to which graduated masks can also very advantageously be created. One application of this is particularly in optical devices in which gradients in the resist thickness are needed. In microoptics, otherwise, the problem often arises of different etching rates for the photoresist and for the material to which the photoresist is to be applied. This problem is advantageously solved, however, by the method of the invention and with the aid of the device of the invention.

According to the invention, it is in fact possible to address even very markedly structured surfaces that are otherwise inaccessible to the method of the prior art. Even microscopic pores can be provided with a suitable photoresist layer. It proves to be especially advantageous that even a single resist trace can be formed and, in particular, photoresist can be applied in small regions and locally, respectively. As a result, not only can arbitrary shapes be formed from the photoresist, but also economies in cost are also achieved, because the photoresist is applied solely to those locations at which it is actually needed. Otherwise, particularly in large-area coverage applicable by the methods of the prior art, the costs for photoresist are very high.

According to the invention, in relation to the resist thicknesses mentioned in the published German Patent Document DE 30 12 988 A1, very thin resist layer thicknesses of up to about 10 $\mu$m are possible. The very thin resist layer thicknesses required in semiconductor coating, of one to two micrometers, for example, can therefore be achieved very easily with the method and device according to the invention. This thin resist layer thickness is especially important particularly in high-precision manufacture, that is, uniform application over the entire surface of the body of rotation, because a light exposure time of only a few seconds is employed. Even a minimal layer thickness of 25 $\mu$m is markedly above the photoresist thickness required for thin-film applications. One such method, described in the aforementioned published German Patent Document DE 30 12 988 A1, is entirely unsuitable for producing homogeneous layers with thicknesses ranging from 0.1 to 3 $\mu$m, used especially for layer structuring, especially also because tolerable variations in photoresist thickness are only in the range of up to 10%. For a uniform irradiation dosage, thick resist layers are otherwise not developed all the way through, or if there is an overdose of UV (ultraviolet) radiation, the structural dimensions are subject to locally sharp fluctuations. It is especially advantageously possible with the method and the device of the invention to provide a locally defined resist coating in the range in particular of a few hundred square micrometers. One especially preferred technological application here is in the field of sensor systems. An especially precise coating is very relevant in this field. By the methods of the prior art, coating of only a minimum area of several hundred square centimeters is possible, and local variation of the photoresist layer thickness to form the geometrical structure thereof is impossible.

An especially preferred application is also in the field of microoptics or microsystem technology. Its use in machine components proves to be especially advantageous as well, particularly on a shaft with integrated and directly applied thin-film sensors. The photoresist mask required for the structuring is then applied locally by the method of the invention.

Besides the cost savings for the photoresist, the reduced environmental pollution proves especially advantageous, because the photoresist losses, which otherwise occur in great quantities in the spraying or spinning methods, are absent or virtually absent here.

It proves to be especially advantageous that in varnishing especially previously-coated machine components, in which the coating has a low surface energy, that the photoresist layer applied according to the invention, with a thickness of 2.2 $\mu$m, for example, exhibits markedly better adhesion to the surface of the machine component, or of the corresponding substrate on the surface thereof, than is possible with varnishing by the immersion method of the prior art. The machine components here may for example be cylinders, shafts, bearing shells, round bars, or tools of arbitrary shapes.

The point source devices of the container are understood to mean feeders or sources for the photoresist that make it possible to apply the photoresist to the surface of the base body in dots using especially small dosages. Preferably, either glass-fiber bodies or fiber bodies or styli with a suitably shaped tip geometry or capillary tubules with a suitably shaped tip geometry or nozzle-like devices, in particular in conjunction with a pulse or impulse printer, are used. In a particularly preferred embodiment, the point source devices may be provided in the form of a so-called array, that is, a plurality of individual devices in front of and next to one another. Depending upon the particular embodiment of the point source devices, the photoresist application can be performed by the dot source device coming in contact with the surface of the base body, or by photoresist droplets applied to the surface of the base body, in which case the dot source devices or dot source device is disposed at a defined spaced distance from the surface of the base body. If a so-called array of point source devices is provided, then the individual devices are liftable, that is, indexable, in a predetermined order from the surface, so that photoresist is then applied in a defined manner only to certain points.

A spacing sensor is advantageously provided for guiding the container having the point source device or point source devices at a constant, predetermined distance from the surface of the base body. As a result, advantageously, even arbitrarily shaped surfaces of a body of rotation or of a rotatable base body can be provided precisely with a defined resist layer thickness.

Especially advantageously, stepping motors are used for the advancement of the container having the point source device or devices. In an application-specific manner, the stepping motors can also execute the tiniest possible advancement increments, and in particular also a motion in different directions. By suitable construction of the feed of the container and the rotational speed of the base body in the device, major degrees of freedom are advantageously provided for applying the photoresist to the base body surface.

Also especially advantageously, an impulse or pulse printer with a nozzle-like point source device cooperates with an actuator system, in particular a piezoelectric actuator system. The nozzle-like point or dot source device or devices preferably communicate with the supply chamber for the photoresist via suitably dimensioned connecting elements. The supply chamber may be disposed at an arbitrary location, because the pulse printer intrinsically transports the photoresist to the nozzle-like point source devices. If conversely the nozzle-like dot or point source devices are acted upon by the photoresist via gravity flow, it is then preferred that the supply chamber for the photoresist be disposed above the nozzle-like dot or point source devices.

The defined tip geometry of the dot or point source devices is especially advantageously shaped conically, and in particular it has a radius of curvature in the range of from 1 $\mu$m to 100 $\mu$m.

If an impulse or pulse printer for the dot or point source device is provided, then for supplying photoresist in a defined manner, pressure regulation may be provided in the region of the supply chamber for the photoresist.

When photoresists of different viscosities and compositions are applied, or if primers or other adhesion promoters are applied, then especially advantageous control of the method is provided, so that a cohesive layer of photoresist is created in a defined portion of the base body. Furthermore, the application of photoresist is especially advantageously performed in a chamber containing a saturated solvent vapor, the base body and the container, that is, elements of the device of the invention, being disposed in that chamber.

Other features which are considered as characteristic for the invention are set forth in the appended claims.

Although the invention is illustrated and described herein as a method and a device for applying photoresist to a base body surface, it is nevertheless not intended to be limited to the details shown, because various modifications and structural changes may be made therein without departing from the spirit of the invention and within the scope and range of equivalence of the claims.

The construction and method of operation of the invention, however, together with additional objects and advantages thereof will be best understood from the following description of specific embodiments when read in connection with the accompanying drawings, wherein:

DESCRIPTION OF THE PREFERRED EMBODIMENTS

Figure 1:
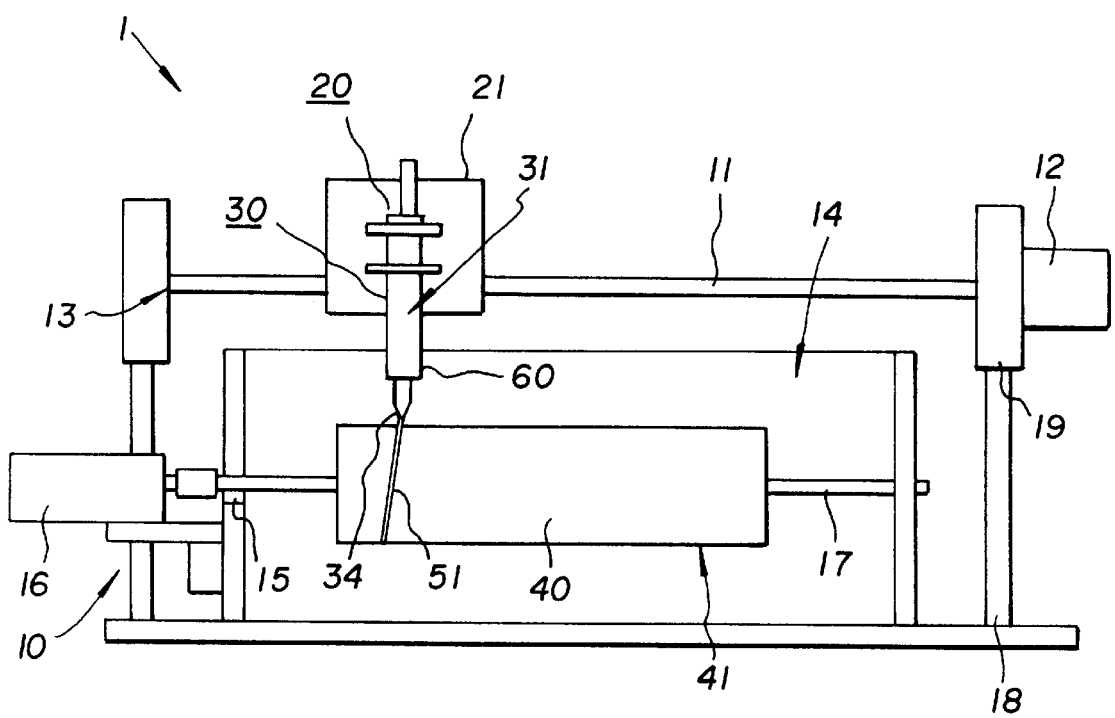
FIG. 1 is a diagrammatic side elevational view of a basic layout of a device for applying photoresist to a base body surface.

Referring now to the drawings and, first, particularly to FIG. 1 thereof, there is shown therein in a diagrammatic side elevational view, the layout of a device 1 according to the invention for applying photoresist. The device 1 has a frame 10. On the frame 10, supported on suitable retaining elements, displacement devices or rotation devices for creating relative motion between a base body 40 and a container 20 are shown. The photoresist feeder 20 has a displaceable housing 21. The housing 21 is displaceable in an X-Z or horizontal direction along an X-Z or horizontal displacement device 11 as shown in FIG. 1. The displacement device 11 may be a spindle, for example. It is supported on retaining elements 18 by respective bearings 13. The displacement device 11 is driven by a motor-driven drive 12. This may preferably be a stepping motor. Consequently, even tiny advancement increments can be achieved. By making a suitable change within the retaining elements 18 or the bearings 13 of the displacement device 11, a change in the y or vertical direction can also be made, so that the container 20 is thereby movable in all three directions in space.

The base body 40 is disposed in a receptacle 14 and, as shown in FIG. 1, is formed as a cylinder held at both ends thereof by suitable clamping devices 17. The clamping devices 17 are rotatably supported in respective bearings 15 of the receptacle 14. For rotating the base body 40, a drive 16 is coupled to one of the clamping devices 17 outside the respective bearing 15 of the receptacle 14.

Preferably, both of the drives 12 and 16 are motor-driven and controllable. Consequently, an optimal adjustment or adaptation can be made to the particular base body and the particular coating surface to be made, and to the type and thickness of the photoresist varnish coating, respectively.

The housing 21 of the container 20 moves, in the form of a carriage, on the displacement device 11. During the motion of the housing 21, photoresist from a point source device 30 of the container 20 is applied in the form of a trace or track 51 to the base body 40 at desired locations. The point source device 30 shown in FIG. 1 is in contact with the surface 41 of the base body 40. In an alternative embodiment, however, it is also possible to provide a distance, preferably a defined spacing, between the surface 41 of the base body 40 and the outlet opening at the tip 34 of the point source device 30. To maintain this defined spacing or distance, it is especially advantageous to provide a sensor 60 for monitoring the applicable spacing. In the embodiment of FIG. 1, one such spacing sensor 60 is shown disposed, by way of example, on the point source device 30.

However, it may also be disposed at some arbitrary location on the container 20 or the housing 21 thereof.

The point source device 30 has a reservoir 31, wherein the photoresist is kept in reserve.

Figure 2:
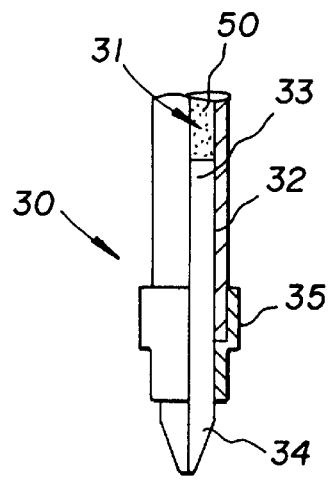
FIG. 2 is an enlarged fragmentary side elevational view, partly in section, of FIG. 1, showing a first embodiment of a point source device according to the invention.

A first embodiment of a point source device 30 according to the invention can be seen in greater detail in FIG. 2. The embodiment of the point source device 30 shown therein has the reservoir 31 for the photoresist 50 located in an upper region thereof. The reservoir 31 is sheathed by a tubule 32. It is especially preferred that the wall of the tubule 32 be simultaneously the outer wall of the reservoir 31.

A fiber bundle 33 is disposed in the tubule 32 below the reservoir 31. By way of example, it is a glass-fiber bundle. It has a conically shaped tip 34. The tip 34 protrudes past the lower boundary of the tubule 32. For a slip-free joinder of the tubule 32 and the fiber bundle 33, a shrink-fit sleeve 35 is shrunk thereon in the transitional region between the end of the tubule 32 and the protruding fiber bundle 33. Consequently, there is also no risk that, upon contact with the surface 41 of the base body 40, the fiber bundle 33 will be pushed by even slight contact inwardly into the tubule 32. Such an effect is otherwise familiar in conventional fiber-tipped markers. The tubule 32 is preferably made of glass.

The photoresist varnish 50 reaches the tip 34 of the fiber bundle 33 by force of gravity, whereupon the fiber bundle 33 absorbs the resist varnish 50 until full absorption has occurred. It is therefore unnecessary to provide an additional pumping or pressurizing device for feeding the photoresist out of the point source device 30 and onto the base body 40. However, in an alternative embodiment, such a provision may nevertheless be made, especially in order to speed up the emergence of the resist from the point source device 30.

The operation of applying the photoresist 50 is effected by displacing the photoresist feeder 20 with the motor-driven drive 12 in a defined manner in the x-z direction. This is performed continuously, in particular. During this adjustment or positioning, the photoresist emerges from the tip 34 of the point source device 30. This, too, is preferably also continuous, in particular, due to contact with the surface 41 of the base body 40. When the point source device 30 is lifted, under the control of the x-y-positioning device 19 in the retaining element 18, the feeding of photoresist can then be stopped automatically. This interrupts the formation of the trace or track 51 on the surface 41 of the base body 40.

The thickness of the photoresist layer, at a given viscosity, is adjusted by the relative motion and relative speed between the X-Z displacement motion of the delivery device 20 and the rotary speed of the base body 40, which is controlled and regulated by the drive 16. Preferably, at least the motor-driven drive 12 is computer-controlled in this regard. Consequently, the base body and also a substrate provided thereon, respectively, together with the base body can advantageously be moved together in rotation and in an oscillating motion relative to the point source device 30. In this manner, full-surface varnishing of the surface 41 of the base body 40 can be achieved. However, it is also thus possible, especially by an alternating reciprocating motion, to perform the varnishing in partial fields or in a small, defined region. The varnishing is thereby locally or linearly defined and is applied homogeneously. The appropriate triggering is preferably again performed with the aid of a computer.

By the device shown in FIG. 1, graduated courses of motion, for example, can also be performed, by which a targeted local variation in the layer thickness of the photoresist can be produced. Accordingly, graduated patterns can be formed in the photoresist mask and can be utilized, by employing suitable lighting and etching processes to produce three-dimensional microcircuitry components.

As photoresist, for example, a suitable varnish made by Hoechst and sold under the designation AZ 6615, can be used.

If a photoresist layer 2.3 $\mu$m thick, for example, is to be applied to a cylinder, this is then done by the contact method, for example. As the base body 40, the cylinder is rotated constantly by the drive 16, and the photoresist feeder 20 is also displaced constantly, relative to the surface 41 to be varnished and the jacket face of the cylinder, respectively, by the motor-driven drive 12 in conjunction with the displacement device 11. A helical line 51 is formed thereby on the jacket surface 41. This line 51 is made so narrow or fine that, due to the narrow or fine thickness thereof, the adjacent lines of photoresist run together. The viscosity of the photoresist is preferably equivalent to the viscosity as shipped, and as specified by the manufacturer, in particular as 21 cSt (and also provided in mm$^2$/s at 25 C, respectively). The thickness of the photoresist layer on the jacket surface 41 of the cylinder is dependent not only upon the relative motion of the container 20 and the cylinder 40, but also on the supply pressure and on the permeability of the fiber bundle, formed especially as a glass-fiber bundle, and particularly in the region of tip 34 thereof. By purposefully changing these parameters, the layer thickness of the photoresist can be varied in a relatively simple manner.

The sought-after thicknesses of the photoresist layer may be varied between 0.2 and 50 $\mu$m, with an accuracy of less than 3%. For example, a layer thickness of 2.2 $\mu$m can be made with the aforementioned photoresist at an advancement speed of the container 20 of 1.2 mm/s and a rotational speed of the base body 40 of 0.08 revolutions per second.

Figure 3:
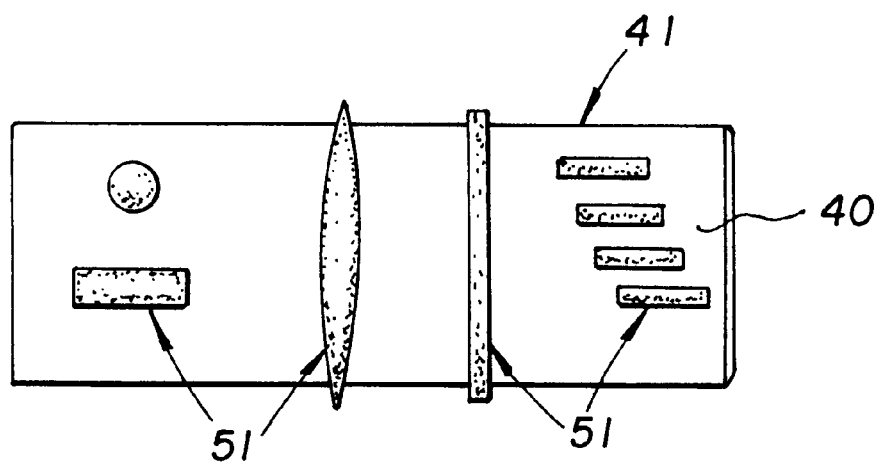
FIG. 3 is an enlarged fragmentary view of FIG. 1 showing the cylinder thereof having a surface that is partly varnished.

FIG. 3 shows a cylindrical base body 40, the surface 41 of which is partly coated with photoresist. It is believed to be readily apparent that, by the method of the invention, both striplike and dotlike and, in particular, rectangular traces or tracks can be applied to the surface 41 of the cylinder 40. The coating method is therefore also suitable, among other purposes, for making impression cylinder blanks for the printing industry, and so forth.

Figure 4:
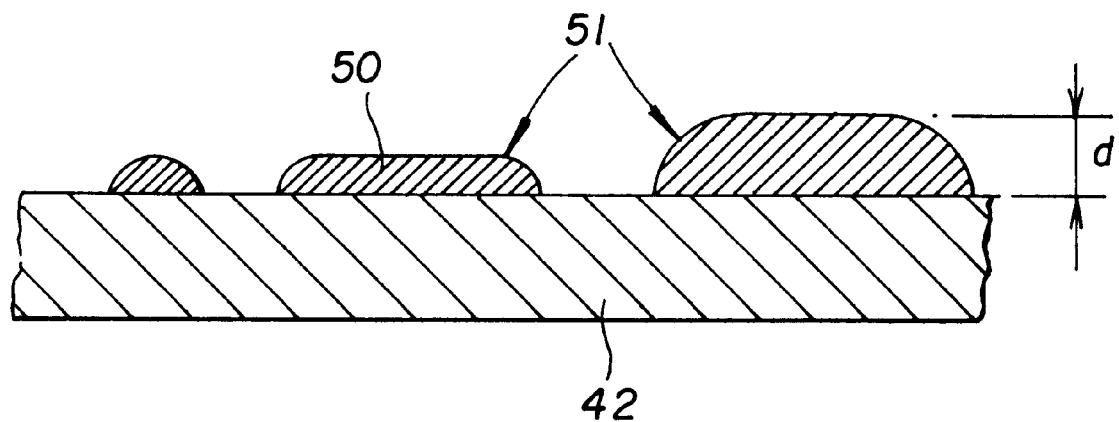
FIG. 4 is a sectional view of a substrate with photoresist varnish profiles formed thereon.

In FIG. 4, a suitable substrate 42 is shown in a sectional view. The substrate 42 is provided with traces or tracks 51 of photoresist 50. The individual traces 51, respectively, have different profiles. The corresponding thickness d of the photoresist varies and can be adjusted by adjusting the relative motion of the substrate 42 and the point source device 30, and by controlling the supply pressure of the photoresist out of the corresponding reservoir 31.

Figure 5:
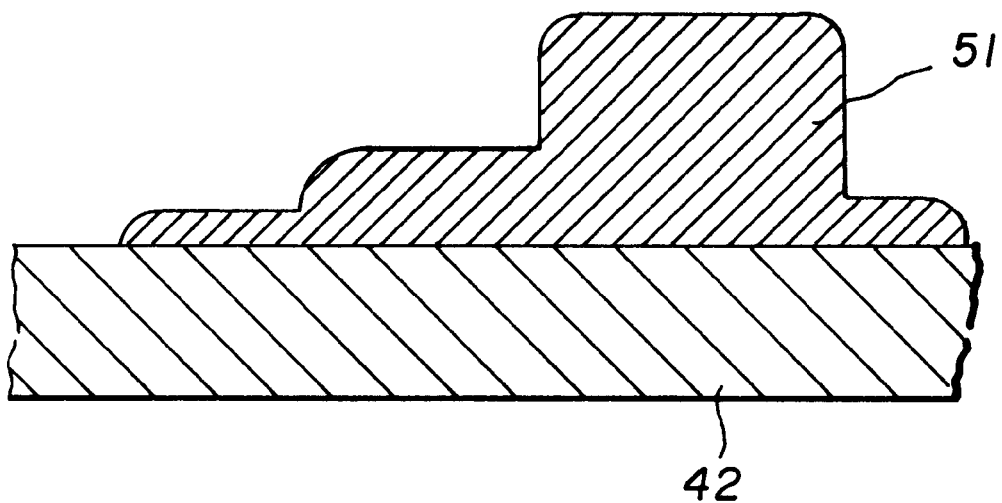
FIG. 5 is a sectional view like that of FIG. 4 of a substrate with a different photoresist varnish profile.

A correspondingly different embodiment of the photoresist profile on the substrate surface is shown in FIG. 5. Here, different graduations of resist thicknesses are provided, and a graduated mask is joined to the surface of the substrate.

Figure 6:
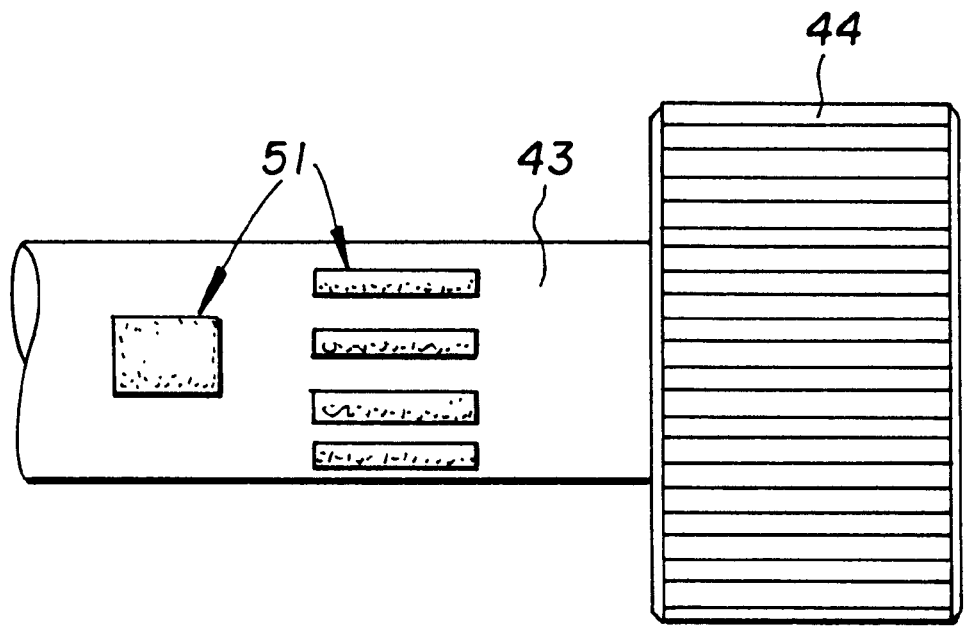
FIG. 6 is a fragmentary side elevational view of a gear wheel shaft with a gear wheel mounted thereon, and with thin-film sensors applied to the shaft surface in accordance with the invention.

FIG. 6 is a plan view of a gear wheel shaft 43 for a gear wheel 44, the shaft 43 being partly coated or varnished with photoresist. This partial coating with the photoresist can be utilized to form thin-film sensors on the surface of the gear wheel shaft 43. Such thin-film sensors are used, for example, for constantly monitoring whether the gear wheel shaft 43 is in a proper condition thereof.

Figure 7:
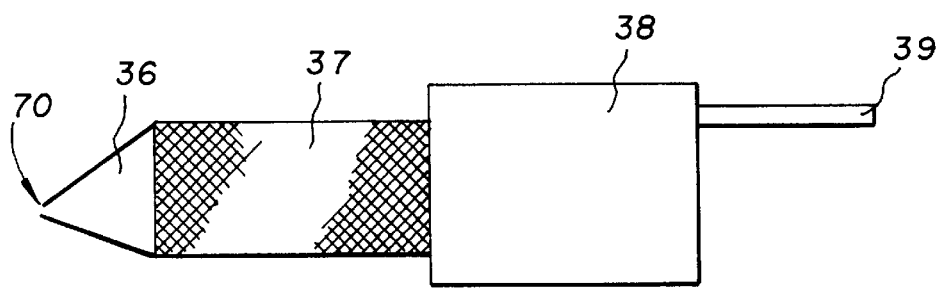
FIG. 7 is a diagrammatic side elevational view of an alternative embodiment of the point source device.

FIG. 7 is a side elevational view of the basic layout of a pointed source device in the form of a pulse printing device. The pulse printing device has a nozzle portion 36 in the form of a front tip with an outlet opening 70. Behind the latter, a piezoelectric actuator 37 is provided, that communicates with a supply chamber 38 for photoresist. This chamber 38 is connected, via a connecting element 39, to a centrally provided photoresist reservoir and is supplied thereby with photoresist.

Figure 8:
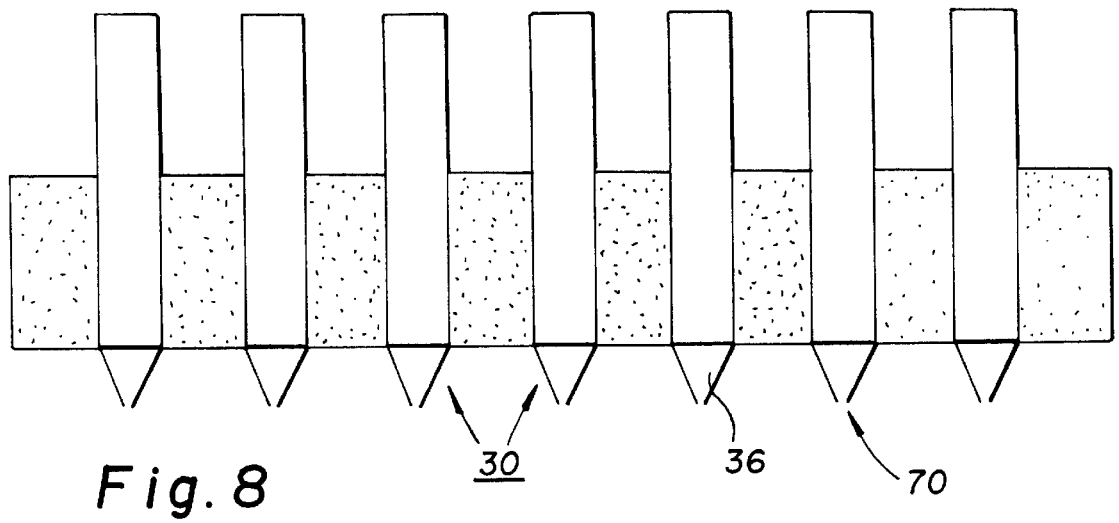
FIG. 8 is a diagrammatic sectional view of a plurality of point source devices disposed side by side in a row.

FIG. 8 is a sectional view of a plurality of point source devices 30 disposed and retained side by side in rows. In particular, the point source devices are pulse printing devices. They form a row for varnishing or coating with a broad trace or track an uneven surface of a base body.

Figure 9:
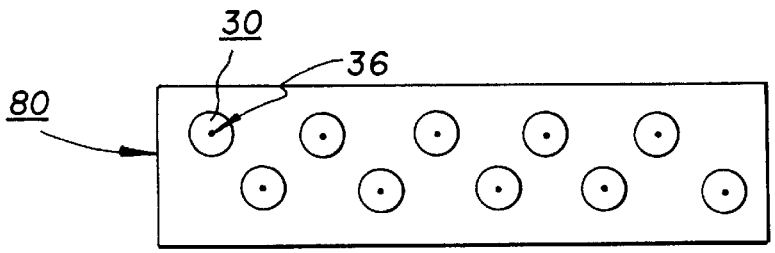
FIG. 9 is a view from below on an array of point source devices.

FIG. 9 shows an embodiment of a plurality of point source devices, arranged a really and offset from one another, in a view from below. The point source devices accordingly form a so-called array 80 for coating or varnishing with a broad trace or track. The point source devices may be in nozzle or stylus form and may be triggerable or controllable, in particular separately.

We claim:

1. An applicator device for applying photoresist to a surface of a base body, comprising:
   a carriage movable relative to a flat or curved surface of a base body;
   a point source device associated with said carriage;
   a conically shaped tip formed on said point source device contacting the surface of said base body for applying photoresist, said conically shaped tip including a fibrous capillary system with a conically tapering tip having a radius of curvature between 1 $\mu$m 100 $\mu$m.

2. The applicator device according to claim 1, wherein said capillary system with said conically tapering tip is made of a conically tapering fiber bundle.

3. The applicator device according to claim 1, wherein said point source device is a pulse point source device.

4. The applicator device according to claim 1, wherein said point source device has a tubule including a reservoir for photoresist and a shrink-fitting sleeve connecting said capillary system with said tubule.

5. The applicator device according to claim 3, wherein said pulse point source device has at least one nozzle-like element, an actuator system, a reservoir for photoresist, and connecting elements for connecting said at least one nozzle element and said reservoir.

6. The applicator device according to claim 1, wherein said point source device is at least one of an indexable array of point source devices.

7. The applicator device according to claim 6, wherein said at least one indexable array of nozzles is formed of a plurality of separately triggerable nozzles.

8. The applicator device according to claim 1, wherein said base body is a three dimensional body.

9. The applicator device according to claim 1, wherein said carriage contains a supply source of photoresist.

* * * * *